United States Patent [19]
Sindzingre et al.

[11] Patent Number: 6,021,940
[45] Date of Patent: Feb. 8, 2000

[54] METHOD AND APPARATUS FOR REFLOW SOLDERING METALLIC SURFACES

[75] Inventors: Thierry Sindzingre, Cachan; Stéphane Rabia, Gif sur Yvette; Denis Verbokhaven, Paris; Gilles Conor, Palaiseau, all of France

[73] Assignee: L'Air Liquide, Societe Anonyme Pour l'Etude et l'Exploitation des Procedes Georges Claude, Paris, France

[21] Appl. No.: 08/967,041

[22] Filed: Nov. 10, 1997

Related U.S. Application Data

[63] Continuation-in-part of application No. 08/356,682, Dec. 15, 1994.

[30] Foreign Application Priority Data

Dec. 15, 1993 [FR] France .................................. 93 15112

[51] Int. Cl.[7] .................................................. B23K 31/00
[52] U.S. Cl. ..................... 228/203; 228/218; 228/207; 228/223; 228/245; 228/253; 228/205
[58] Field of Search ..................... 228/218, 203, 228/179.1, 207, 223, 260, 180.1, 180.21, 118, 245, 248.1, 253, 205

[56] References Cited

U.S. PATENT DOCUMENTS

| | | |
|---|---|---|
| 2,085,587 | 6/1937 | Hotchkiss .................... 113/112 |
| 3,665,590 | 5/1972 | Percival . |
| 3,806,698 | 4/1974 | Hare et al. . |
| 4,538,757 | 9/1985 | Bertiger . |
| 4,646,958 | 3/1987 | Howard . |
| 4,937,006 | 6/1990 | Bickford et al. .................... 228/219 |
| 5,000,819 | 3/1991 | Pedder et al. .................... 156/643 |
| 5,192,582 | 3/1993 | Liedke et al. . |
| 5,207,839 | 5/1993 | Clavereri et al. . |
| 5,236,512 | 8/1993 | Rogers et al. . |
| 5,341,980 | 8/1994 | Nishikawa et al. .................... 228/205 |
| 5,409,543 | 4/1995 | Panitz et al. .................... 134/2 |
| 5,433,820 | 7/1995 | Sindzingre et al. .................... 216/13 |
| 5,458,856 | 10/1995 | Marie et al. .................... 422/186 |

FOREIGN PATENT DOCUMENTS

| | | |
|---|---|---|
| 371 693 | 6/1990 | European Pat. Off. . |
| 427 020 | 5/1991 | European Pat. Off. . |
| 552 096 | 7/1993 | European Pat. Off. . |

*Primary Examiner*—Patrick Ryan
*Assistant Examiner*—M. Alexandra Elve
*Attorney, Agent, or Firm*—Burns, Doane, Swecker & Mathis, L.L.P.

[57] ABSTRACT

The invention relates to a method for dry cleaning or dry fluxing metallic surfaces before, during, or after a reflow soldering operation. The metallic surfaces that are dry cleaned or dry fluxed include (1) the metallic substrate on which an at least partially metallic, electronic component is to be mounted, (2) the solder paste, and (3) the metallic portions of the electronic component. The method comprises treating the metallic surface with a gaseous treatment atmosphere comprising unstable or excited gaseous species, and is substantially free of electrically charged species.

32 Claims, 1 Drawing Sheet

METHOD AND APPARATUS FOR REFLOW SOLDERING METALLIC SURFACES

CROSS-REFERENCE TO RELATED APPLICATIONS

This application is a continuation-in-part of application Ser. No. 08/356,682, filed on Dec. 15, 1994; the entire content of which is hereby incorporated by reference.

FIELD OF THE INVENTION

This invention relates to a method and apparatus for reflow soldering metallic surfaces. The method includes a step and the apparatus includes a device for dry fluxing or dry cleaning the metallic surfaces, at close to atmospheric pressure, with a gas comprising excited or unstable species and substantially free of electrically charged species.

BACKGROUND OF THE INVENTION

The present invention relates to the operation of fluxing or cleaning metallic surfaces which is generally involved before, during or after operations of soldering or tinning in electronics. It thus applies in particular to the fluxing involved before the operations:

- of soldering components onto a circuit (both in the case of inserted components and surface-mounted components)
- of soldering contact strips onto electronic supports, making it possible to connect the support in question onto another support (mention may here be made of the example of a hybrid circuit or of a printed circuit which is to be inserted using these contacts into a printed circuit, or else a hybrid or printed circuit which can be plugged, using its connection edge, into a connector),
- of soldering circuits into bottoms of packages (involved during encapsulation of such circuits),
- of soldering involved during packaging closure procedures, of soldering bare chips onto supports such as a printed circuit, hybrid circuits or else multilayer interconnection substrates such as the substrates commonly called MCM (multi-chip modules),
- tinning terminations of electronic components.

The role of fluxing is then to clean the metallic surfaces to be soldered or tinned (degreasing, deoxidation, decontamination of adsorbed layers, etc.), this being with the aim of facilitating subsequent wetting of these surfaces by the solder.

This fluxing operation is most commonly carried out using chemical fluxes which are often obtained from resin bases, supplemented in particular by acidic compounds. After soldering, flux residues remain on the article, often requiring the manufacturer to carry out a cleaning operation, most often using chlorinated solvents, which cleaning operation proves particularly problematic in the case of bare chips because they are very fragile, and is also highly controversial, in the context of the "Montreal Protocol" which strictly regulates or even, in the case of some, depending on the countries, completely prohibits such solvents.

Two of the methods most commonly used for carrying out the soldering operation are called "wave soldering" and "reflow soldering".

In the first case (wave soldering machines), the design of these machines is such that the articles to be soldered or to be tinned are brought into contact with one or more waves of liquid solder which are obtained by circulation of the solder bath contained in a vat through a nozzle.

The articles (for example the circuits onto which the components have been attached, or else the components to be tinned) have generally been fluxed beforehand in an upstream zone of the machine, using a flux spray or a flux foam, the fluxing operation being followed by a so-called preheating operation which is carried out in order to activate the fluxes previously deposited on the circuit and in order to preheat the circuits or the components before they reach the hot soldering zone. A conveyor system is present for moving the articles from one zone of the machine to another.

These machines are traditionally open to the ambient air atmosphere.

In the case of the second type of method (reflow soldering), which term moreover encompasses a plurality of techniques, use is made no longer of a liquid solder bath but of a soldering paste containing the solder alloy (paste formulation in which the flux is included) which is deposited on the support (circuit before deposition of the components, edges of the package to be closed, or else package bottom) and to which a certain quantity of heat is supplied, making it possible to melt the metallic alloy. This heat transfer is most often carried out in a continuous oven.

In either case (wave or reflow), the problem arises of the above mentioned cleaning operation after soldering, which most often uses chlorinated solvents which are strongly regulated by the Montreal Protocol and its subsequent revisions.

This problem has therefore provided the motivation for a number of research efforts throughout the world over the past few years in order to try to provide a solution replacing use of these compounds.

Among the solutions envisaged, mention may be made of plasma cleaning of surfaces before soldering, thereby avoiding using chemical fluxes and therefore the actual requirement of a downstream cleaning operation. The mixtures envisaged used, in particular, hydrogen.

In this field, mention may be made of document EP-A-0,427,020, which proposes treating assembly parts to be soldered using a plasma of a process gas, recommending the use of low pressures for this treatment "with the aim of avoiding thermal damage to the assembly parts". All the examples given, in conjunction with the figures provided, relate to pressure conditions varying in the range of 30–100 Pa.

The same comment can be made in regard of document EP-A-0,371,693, which relates to a method of cleaning metallic surfaces before soldering using microwave plasma containing hydrogen. Here again, it is recommended (and illustrated throughout the examples) to use low pressures "in order to make it possible to limit the level of residual oxygen in the plasma".

This consensus of opinion in favor of the use of low pressure conditions for carrying out these plasma cleaning operations, despite the drawbacks which are in particular linked with the cost of obtaining such pressures or else the difficulty of implanting the corresponding infrastructures in a production line, is undoubtedly linked with the technical and technological difficulty of obtaining, at atmospheric pressure, plasmas which give performance comparable to that which is traditionally obtained at low pressure.

In this context, the Applicant Company has, in document FR-A-2,697,456, the content of which is incorporated herein by way of reference, recently proposed a method of plasma fluxing metallic surfaces before soldering, at atmospheric pressure and using, in order to create the plasma, a microwave source or else a corona discharge transferred via slots placed suitably in a dielectric layer placed above the article to be treated. Although this application provides an advantageous solution to the problem in question, the Applicant Company has demonstrated the fact that the proposed method might be improved, especially as regards:

its efficiency (ratio of power input for creating the plasma to the density of species produced which actually interact with the support to be treated), or else the power density obtained (in the case of corona discharge, it reaches only a few watts (W) per unit surface area of dielectric), which, if they were to be enhanced, might permit shorter treatment times, and also the fact of limiting "geometrical" factors: in the case of corona discharge, the electrode/sample distance is highly critical and must be kept very small, which may cause problems in the case of substrates whose surface structure is relatively convoluted; in the case of microwave discharge, it gives rise to the formation of a plasma-generating spot which has defined dimensions limited by the plasma source, moreover, a plasma as created in this document contains, by definition, ionic species and electrons (and therefore electrically charged species) which are still difficult to use on electronic components.

In parallel, the Applicant Company has recently proposed, in document FR-A-2,692,730, the content of which is assumed to be incorporated herein by way of reference, a device for formation of excited or unstable gas molecules which operates substantially at atmospheric pressure and which offers improved energy density.

In this context, the object of the present invention is to provide an improved method of dry fluxing or dry cleaning metallic surfaces before, during or after soldering or tinning, making it possible:

to operate substantially at atmospheric pressure, to provide a high degree of flexibility in the distance between the object to be treated and the device used for carrying out this treatment, to avoid contact of the articles with charged species, to provide an improved power density, making it possible to achieve an increased treatment speed.

Another object of the present invention is the fluxing or cleaning of metallic surfaces throughout the process by which electronic components are attached by soldering. In this regard, the inventive cleaning or fluxing method can be performed:

(1) To flux a metallic substrate prior to the application of the solder;

(2) After screen printing the solder paste [to flux the paste];

(3) After the mounting of the electronic components on the circuit;

(4) During all or part of the solder reflow operation (for example, during any part of the temperature profile that the article is subjected to in order to cause solder reflow); or (5) After the reflow soldering operation.

SUMMARY OF THE INVENTION

A method of dry fluxing or cleaning a metallic surface before, during or after soldering or tinning using an alloy, according to the invention, is characterized in that the surface to be cleaned or fluxed is treated, at a pressure close to atmospheric pressure, with a gaseous treatment atmosphere comprising excited or unstable species and being substantially free of electrically charged species.

DETAILED DESCRIPTION OF THE INVENTION AND PREFERRED EMBODIMENTS

Figure 1:
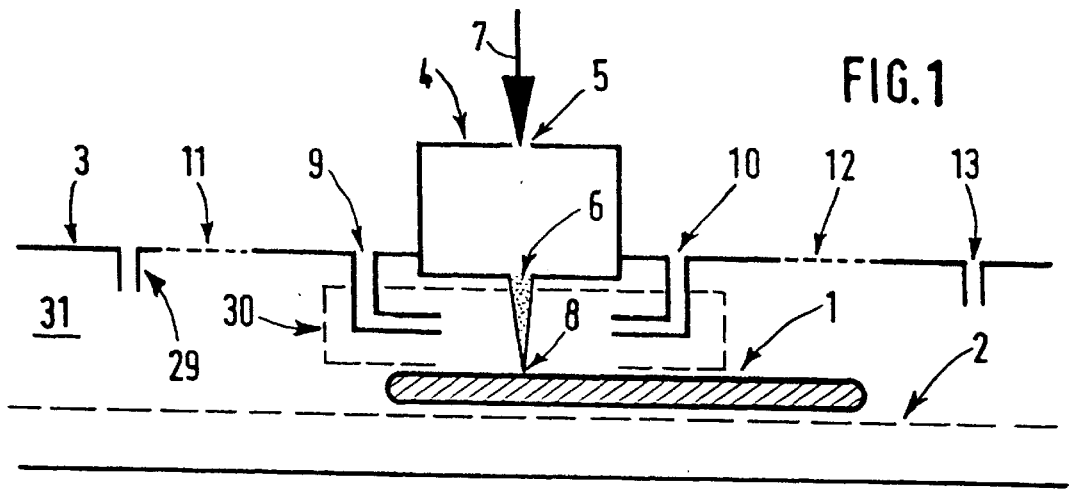
FIG. 1 is a diagrammatic view of an installation suitable for implementing the method according to the invention.

According to the invention, the terms "dry fluxing", "fluxing", "cleaning" and "dry cleaning" are used interchangeably herein to refer to the inventive treatment method. The terms are used to differentiate the point in the soldering or tinning operation where the treatment is performed. For example, fluxing is typically associated with surface treatments prior to soldering or tinning. Thus, "dry fluxing" and "fluxing" refer to treatments prior to tinning or soldering. Conversely, "cleaning" and "dry cleaning" refer to treatments during or after soldering.

According to the invention, the term "metallic surface" is intended to mean any type of metallic surface which may be involved in such operations of soldering or tinning, whether it be, for example, of steel, copper, aluminum, tin, lead, tin/lead, tin/lead/silver, or else alloys such as Kovar, this list being, of course, only indicative and non-limiting. Thus, the metallic surface may be the metallic substrate surface, the solder surface (prior to, during or after reflow), and the metallic surfaces of the mounted electronic components.

Although the method and apparatus of the present invention relate to treating metallic surfaces, other types of surfaces may be cleaned using the inventive treatment depending upon when the inventive treatment is performed. For example, if the cleaning process of the present invention is performed after solder reflow, the cleaning operation effectively cleans the metallic and nonmetallic surfaces (such as the polymer surfaces) of the printed circuit board. If the fluxing is performed prior to screen printing the solder paste, the fluxing operation effectively cleans the metallic surfaces (such as the metallic tracks of the printed circuit board) and other surfaces of the printed circuit board. In this manner, grease and finger prints can be removed from the printed circuit board.

The soldering or tinning "alloy" according to the invention will consist of any composition which might be envisaged for such operations (for example reflow soldering or in a wave soldering machine, or else wave tinning), such as, for example, Sn-Pb, Sn-Pb-Ag, Pb-In etc.

According to the invention, the term "pressure close to atmospheric pressure" is intended to mean a pressure advantageously lying in the range [$0.1 \times 10^5$ Pa, $3 \times 10^5$ Pa].

According to the invention, the term "electrically charged species" is intended to mean ions or electrons. The treatment atmosphere according to the invention is therefore distinguished from classical plasma atmospheres in that it is substantially free of electrically charged species, that is to say ions or electrons.

The treatment atmosphere is advantageously obtained from a primary gas mixture and, optionally, from an adjacent gas mixture, the primary gas mixture being obtained at the gas outlet of at least one apparatus for forming excited or unstable gaseous species, in which an initial gas mixture comprising an inert gas and/or a reducing gas and/or an oxidizing gas has been converted, the adjacent gas mixture not having passed through the apparatus.

This configuration can be termed "post-discharge" since the primary component of the treatment atmosphere, which comprises the excited or unstable gaseous species, is obtained at the outlet of the apparatus, which ensures substantial absence of any electrically charged species in this primary component. The adjacent component of the treatment atmosphere, which has not passed through the apparatus, is a fortiori free of such species.

Furthermore, this configuration makes it possible clearly to dissociate the site of generation of the primary component of the atmosphere from the site of its use, which has a not inconsiderable advantage in terms of pollution of the apparatus (preventing the various releases resulting from the operation of fluxing the surface from polluting the apparatus). Finally, the article, which is not treated within the apparatus (for example within the discharge between the electrodes), benefits from better flexibility in the "distance" aspect explained hereinabove.

The inert gas may, for example, consist of nitrogen, argon, helium or a mixture of such inert gases. The reducing gas may, for example, consist of hydrogen, $CH_4$ or else ammonia or a mixture of such reducing gases. The oxidizing gas may, for its part, for example consist of oxygen or $CO_2$ or else $N_2O$, $H_2O$, or a mixture of such oxidizing gases. A list of gases given in each category is, of course, only an indication and implies no limitation.

According to one aspect of the invention, the initial gas mixture to be transformed inside at least one apparatus contains water vapor. Preferably, the initial gas mixture conzains from about 50 ppm to about 6% by volume water vapor. More preferably, the initial gas mixture contains from about 100 ppm to about 1% by volume water vapor, and most preferably the initial gas mixture contains from about 500 ppm to 5000 ppm by volume water vapor.

According to another aspect of the invention, the initial gas mixture to be transformed inside at least one apparatus contains oxygen or a gas capable of producing oxygen. Preferably, the initial gas mixture contains oxygen in an amount from about 50 to about 5000 ppm by volume, or the initial gas mixture contains a gas capable of producing oxygen in an amount such that the oxygen content is about 50 to about 5000 ppm by volume.

In one aspect of the invention, all or part of the treatment gas obtained at the outlet of the apparatus for forming unstable or excited species can be recycled to form all or part of the initial gas mixture. For example, fans or the venturi effect can be used to recirculate all or part of the treatment gas. Recirculation of treatment gas is described in application Ser. No. 08/877,914.

The apparatus according to the invention consists of any device making it possible to "excite" an initial gas mixture in order to obtain, at the gas outlet of the said apparatus, another gas mixture including unstable or excited species, the latter gas mixture being substantially free of electrically charged species. Such excitation may, for example, be obtained by electrical discharge, for example of the corona discharge type.

As will be fully apparent to the person skilled in the art, the fluxing or cleaning method according to the invention makes it possible to carry out the treatment using the primary mixture obtained at the gas outlet of a single apparatus, or of a plurality of apparatuses placed in parallel over the width of the article to be treated, or else successively using primary mixtures obtained at gas outlets of a plurality of apparatuses placed in series.

Similarly, as will be fully apparent to the person skilled in the art, the method according to the invention is applicable, according to the needs expressed by the user, both to the treatment of a single one of the faces of the article to be treated and to the case in which it is necessary to flux or clean the article on both of its faces. In the latter case, it will be suitable to arrange the required apparatuses in front of each face of the article.

The adjacent mixture according to the invention may consist of any gas or gas mixture, for example of an inert gas or mixture of inert gases making it possible to maintain, if required, a protective atmosphere around the samples, or else a reducing gas or an oxidizing gas, or even a mixture of gases belonging to one of these three categories.

According to one of the aspects of the invention, the adjacent mixture contains silane $SiH_4$. The presence of such an adjacent mixture containing silane is advantageously used for its reducing action with regard to certain metal oxides present on the surface of the article to be treated and also, according to the initial gas mixture used, as an oxygen "scavenger" (or trap), that is to say in its interaction with the residual oxygen in the atmosphere present above the article to be treated, with the aim of reducing this level of residual oxygen to a minimum.

According to another aspect of the invention, the surface to be treated is heated to a temperature lying between the ambient temperature and the melting temperature of the metallic surface or of the alloy used for carrying out the subsequent soldering or tinning operation. This upper limit will therefore depend on the metal or alloy used, and it will, for example, lie in the vicinity of 180° C. in the case of the Sn63-Pb37 or Sn62-Pb36-Ag2 alloys conventionally used.

According to one of the aspects of the invention, the article having the metallic surface or surfaces to be treated is brought in front of the gas outlet of the apparatus, optionally in front of the gas outlets of a plurality of apparatuses placed in parallel over the width of the article and/or successively in front of the gas outlets of a plurality of apparatuses placed in series, by a conveyor system passing through an internal space defined by a covering structure (for example a tunnel or a set of elementary hoods), and isolated from the surrounding atmosphere, the said structure being connected in a leaktight manner to the said apparatus or including the said apparatus.

The same comment made hereinabove is applicable here, regarding double-sided treatment (here again, it is sufficient to employ the requisite number and arrangement of apparatuses in front of each face of the article).

According to one of the embodiments of the invention, the apparatus in which the said initial gas mixture is converted is the site of an electrical discharge created between a first electrode and a second electrode, a layer of dielectric material being arranged on the surface of at least one of the electrodes, facing the other electrode, the initial gas mixture passing through the discharge transversely to the electrodes.

The power employed in the apparatus, normalized per unit surface area of dielectric will then advantageously be greater than 1 $W/cm^2$, preferably greater than 10 $W/cm^2$.

According to one of the embodiments of the invention, the treatment atmosphere successively encountered by the article to be treated along the conveyor is zoned in the following manner:

a) at least one of the apparatuses for forming excited or unstable gas species converts a different initial gas mixture from that converted by the apparatus preceding it in the said structure, and/or b) the adjacent gas mixture employed at the level of at least one of the apparatuses for forming excited or unstable gas species is different from that employed at the level of the apparatus preceding it in the said structure.

According to one of the embodiments of the invention, steps a) and b) above may relate to one and the same apparatus.

It will thus, for example, be possible to use mixtures having a reducing power which increases from one apparatus to another.

According to one of the aspects of the invention, on leaving the said structure, the article enters a machine in which the said soldering or tinning operation is carried out, the article being, if required, maintained under a protective atmosphere between the exit of the said structure and the entry of the said machine. The soldering operation may be carried out, for example, by screen printing a solder paste onto the substrate and supplying heat sufficient to cause melting of the solder alloy. The term protective atmosphere is in this case intended to mean an essentially inert atmosphere in which the residual oxygen concentration does not exceed a few hundreds of ppm, or even 100 ppm.

According to another aspect of the invention, the [said] soldering or tinning operation is carried out within the actual covering structure (for example a tunnel), upstream, downstream, or in the same vicinity of the apparatus for generating unstable or excited gaseous species.

According to one aspect of the invention, the conductive lines and pads of a circuit are fluxed prior to screen printing a solder paste thereon.

According to another aspect of the invention, the article can be brought in from of at least one apparatus for forming unstable or excited gas species after the substrate has had solder applied and the electronic components mounted, but prior to causing solder reflow. The fluxing operation acts to clean exposed metallic surfaces including the solder surface and terminations or legs of the electronic components to be mounted. If required, the article can be maintained under the above-described protective atmosphere after the fluxing treatment until the treatment to cause solder reflow.

In yet another aspect of the invention, the inventive cleaning method can be used for post-soldering cleaning. After the article has been heated to cause solder reflow in the case of reflow soldering, or after the application of the solder in wave soldering, the reflowed assembly may be brought in front of one or more apparatuses for forming excited or unstable gas species.

In another aspect of the invention, the inventive cleaning method can be used during all or part of solder reflow step. Thus, at least one apparatus for forming excited or unstable gaseous species may be positioned so that it cleans at least one surface of the article during all or part of the solder reflow step. Although not wishing to be bound by theory, it is believed that by subjecting the article to excited or unstable species during solder reflow, the oxides that may be formed on the surface of the soldering alloy during heating can be reduced or eliminated.

Thus, the apparatus and method of present invention generally relate to treating (i.e., fluxing or cleaning) metallic surfaces before, during or after reflow soldering. However, it may be advantageous to employ chemical fluxing on all or part of the metallic surfaces to be tinned or joined. For example, if the inventive treatment is a fluxing operation performed prior to screen printing or during solder reflow, the solder paste may contain a chemical fluxing agent. Similarly, if the inventive treatment is a cleaning performed after solder reflow, the solder paste may contain an active chemical fluxing agent.

The invention also relates to a device for dry fluxing or cleaning of metallic surfaces before, during or after soldering or tinning suitable in particular for implementing the method according to the invention, comprising a covering structure defining an internal space passed through by means for conveying the articles having the metallic surface or surfaces to be fluxed or cleaned, which structure is isolated from the surrounding atmosphere and includes or encloses one or more apparatuses for forming excited or unstable gas species which are mounted in series and/or parallel, comprising at least one tubular gas passage having an axis and formed between an outer electrode and an inner electrode, at least one of the electrodes having, facing the other, a dielectric coating, the electrodes being connected to a high-voltage and high-frequency source, the outer electrode surrounding the dielectric and having an inlet for so-called initial gas and an outlet for so-called primary gas, which are elongated, parallel to the axis and substantially diametrically opposite, the said gas outlet emerging inside the said covering structure, which is optionally fitted with at least one means for injecting a so-called adjacent gas which has not passed through the said apparatus or apparatuses, the device additionally comprising, if required, a means for heating the articles to be treated. The heating means may be such as to heat the metallic surface to aid in cleaning, or to heat the article to cause solder reflow.

Other characteristics and advantages of the present invention will emerge from the following description of embodiments given by way of illustration but without implying any limitation, made with reference to the attached drawings, in which:

FIG. 1 shows the presence of an article 1 having metallic surfaces to be fluxed or cleaned, brought using a conveyor belt 2 in front of the gas outlet 6 of an apparatus 4 for forming excited or unstable gas species.

The conveyor system 2 passes through an internal space 31, defined by a tunnel 3, advantageously connected in a leaktight manner to the apparatus 4.

At 8 is diagrammatically shown the primary gas mixture obtained at the outlet 6 of the apparatus. The primary gas mixture 8 is obtained from an initial gas mixture 7 which enters the apparatus through its gas inlet 5.

The embodiment represented in FIG. 1 also shows the presence of inlets 9, 10 for adjacent gas mixtures. The gaseous atmosphere obtained from the adjacent gas mixtures 9, 10 and from the primary gas mixture 8 constitutes the treatment atmosphere 30 according to the invention.

The presence is noted in the embodiment represented in FIG. 1 of additional apparatuses for forming excited or unstable gas species, not shown, at 11 and 12, in series with the first apparatus 4 and successively encountered by the article 1.

The installation is then completed by other adjacent gas mixture inlets such as those represented at 13 and 29.

The installation is furthermore provided, if required, with a means, not represented in FIG. 1, for heating the article 1. Infrared lamps present in the tunnel or convection heating (hot tunnel walls) or else the fact that the article is placed on a heating substrate holder may, for example, be envisaged for this heating means.

Figure 2:
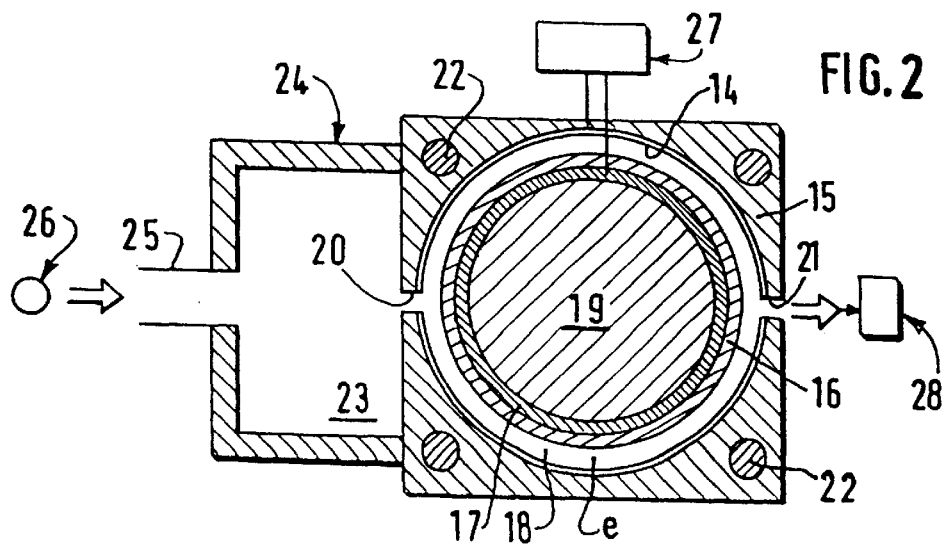
FIG. 2 diagrammatically represents, in section, an example of an apparatus for forming excited or unstable gas species which is suitable for implementing the method according to the invention.

As represented in the embodiment of FIG. 2, the apparatus for this embodiment is of cylindrical geometry and comprises a first tubular electrode 14, formed for example by an internal face of a metallic block 15, in which an assembly comprising a tube 16 of dielectric material, for example of ceramic, is placed concentrically, a second electrode 17 whose thickness is exaggerated for clarity in FIG. 1 being deposited by metallization on the dielectric tube.

The assembly comprising the dielectric 16 and the second electrode 17 thus defines, with the first electrode 14, a tubular gas passage 18 and, internally, an internal volume 19 in which a coolant is circulated, advantageously a Freon for its electronegative character or else deionized water. The internal gas passage 18 has as axial extent of less than 1 m, preferably less than 70 cm, and most preferably less than 50 cm, and its radial thickness e does not exceed 3 mm and is typically less than 2.5 mm.

The block 15 includes two diametrically opposite longitudinal slots 20 and 21 respectively forming the inlet for the initial gas to be excited in the passage 18 and the outlet for the primary gas containing excited or unstable gas species.

The slots 20 and 21 extend over the entire axial length of the cavity 18 and have a height which, in the case of the embodiment represented in FIG. 2, does not exceed the thickness and is typically substantially identical to the latter. The body is advantageously includes, at the periphery of the first electrode 14, a plurality of ducts 22 for passage of a coolant, for example water. The gas inlet communicates with a homogenization chamber or plenum 23 formed in a casing 24 attached to the block 15 and including a tube 25 for supplying initial gas at a pressure of between $0.1 \times 10^5$ Pa and $3 \times 10^5$ Pa, coming from an initial gas source 26. The electrodes 14 and 17 are connected to a high-voltage and high-frequency electrical generator 27 operating at a frequency advantageously greater than 15 kHz and delivering a power of, for example, the order of 10 kw. It may furthermore be advantageous to express this power delivered by the generator by normalizing it per unit surface area of dielectric.

The gas containing the excited species which is available at the gas outlet 21 is sent to a user station 28, for example for fluxing or cleaning metallic surfaces.

An installation such as that described with reference to FIG. 1, incorporating a single apparatus 4 as described with reference to FIG. 2 was used for carrying out the six examples of implementation of the invention which are detailed below, supplemented by two comparative examples.

EXAMPLE 1

For the first example of implementation, samples of electronics grade copper, with dimensions 0.3×50×50 mm were first pickled using a 20% solution of nitric acid in water, before being subjected to thermal oxidation (by heating for 5 min under air at 200° C.). This treatment oxidation gave rise to the appearance of a distinct layer which has turned purple on the surface of the copper samples, the substrates being, before oxidation, naturally of "salmon" color.

The samples were then treated using the installation described above, under the following conditions:

operating power (delivered by the generator): 1000 W, corresponding to a power of 15 W/cm² of dielectric, initial gas mixture comprising 65% of hydrogen in nitrogen (obtained by using flow rates equal to 10 m³/h of nitrogen and 18 m³/h of hydrogen), adjacent gas mixture: nitrogen making it possible to keep the partial pressure of oxygen inside the tunnel below 20 ppm, the sample was heated to a temperature of 150° C., treatment in a single pass: the sample moving, by virtue of the conveyor 2, at a speed of 2 mm/s, treatment carried out substantially at atmospheric pressure, distance between the sample to be treated and the gas outlet of the apparatus: 10 mm.

Observation of the samples treated according to this procedural method showed an excellent surface condition, with the samples returning to their characteristic initial salmon color.

EXAMPLE 2 (COMPARATIVE)

For a second, comparative example, use was made of the microwave-discharge plasma fluxing installation described in document FR-A-2,697,456, in the name of the Applicant Company, which was referred to hereinabove. Copper samples of the same grade, with dimensions 0.3×20×20 mm were, after pickling in nitric acid and thermal preoxidation, treated under the same conditions as in Example No. 1 by microwave plasma discharge, using a mixture of Ar-3%$H_2$ injected at 10 1/min, each sample being heated to a temperature of 150° C., and the power used to create the plasma being 200 W. The time required to pickle each sample was then close to 2 min, whence a longer treatment time than that obtained in the context of Example No. 1, for a smaller sample. It may further be pointed out that this microwave plasma method also has the drawback of using (as its name implies) a plasma, and therefore electrically charged species, which may pose a problem when sensitive electronic components are present.

EXAMPLE 3

For the third example of implementation, a procedure identical to that in Example No. 1 was followed, except for the step of preoxidizing the samples. This time, the oxidation was carried out by following a conventional pollution standard for circuits in electronics, using the so-called "boiling water" method, according to which, after chemical cleaning (nitric acid) the substrates were immersed for 10 min in boiling water. This oxidation is much "gentler" than the thermal method and more representative of the levels of oxidation commonly encountered on electronic circuits before soldering or tinning.

Observation of the samples after treatment here again showed an excellent surface condition, with the samples here again regaining their initial salmon color.

EXAMPLE 4

For a fourth example of implementation, the copper samples obtained in Example No. 3 (nitric acid cleaning, boiling water preoxidation, treatment according to the invention) were evaluated by subjecting them to a wetting process with the tin-lead solder in a machine of the wave tinning type, with the chemical prefluxing technique generally present at the entry of these machines having been intentionally omitted.

Observation of the deposition of solder carried out under such conditions showed an excellent wetting result for deposition on copper (as shown by a small contact angle), good continuity of the deposition and good surface quality of this deposition (demonstrated by its mirror appearance).

This fourth example of implementation thus demonstrated the possibility of carrying out such solder depositions (irrespective of whether a soldering or tinning task is involved) without using conventional prefluxing chemicals which lead to the necessity of subsequently carrying out a cleaning operation after soldering.

EXAMPLE 5 (COMPARATIVE)

For a fifth, comparative example, the samples of Example No. 3 were no longer treated using the method according to the invention but simply pickled using a 20% solution of nitric acid, this being after the boiling water preoxidation step, and before evaluation of these samples by tinning.

The results obtained were here much less convincing, the tin-lead deposition being discontinuous (presence of islands) and the contact angle being much higher than in the preceding case, these results being indicative of less efficient pickling by the nitric acid than that which was obtained according to the invention in the context of Example No. 4.

EXAMPLE 6

In a sixth example of implementation of the invention, use is made of circuits of the epoxy printed circuit type, the conducting tracks of these circuits having been pretinned, electronic components (of the resistive, capacitive, SOT 23 and SO type) having been fixed using a drop of adhesive onto the suitable conducting tracks of the circuit.

The circuits were first subjected to a fluxing treatment according to the invention, as described in the context of Example 1, the distance between the circuit and the gas outlet of the apparatus for forming unstable and excited gas species being of the order of 10 mm. The fluxing operation thus carried out according to the invention was then evaluated by an operation of soldering the components (and therefore making of electrical contacts) by passing the circuits through a conventional wave soldering machine, the chemical prefluxing step present at the entry of the machine having been intentionally omitted. Observing the solder contacts on leaving the machine demonstrated excellent wetting, and thereby confirmed the possibility of carrying out dry fluxing according to the invention, avoiding the use of conventional fluxing by chemical means which generally requires, downstream, an operation of cleaning the circuits after soldering in order to remove the flux residues.

EXAMPLE 7

This example shows the usefulness of the inventive dry fluxing method to clean printed circuit boards prior to screen printing of the solder paste. By subjecting the printed circuit boards to the inventive dry fluxing method, solder wetting is improved because the metallic surfaces of the circuit boards are cleaned. Further, any contamination existing on the boards such as finger prints or grease can be removed.

Pretinned printed circuit boards were cleaned by subjecting them to an atmosphere containing unstable or excited gaseous species. An initial gas mixture of 4% $H_2$, 1000 ppm $H_2O$, remainder nitrogen was passed through the apparatus of FIG. 2 to form a primary gas mixture. The printed circuit board was exposed to the primary gas mixture using a device as shown in FIG. 2 containing only one apparatus for forming excited or unstable gaseous species. The boards were treated under the following conditions:

operating power: 3 kW;

flow rate of initial gas mixture: 18 $m^3$/h;

adjacent gas mixture: nitrogen;

the distance between the boards and the gas outlet of the apparatus was 10 mm; and the boards were not heated.

The treated circuit boards were tested for ionic contamination using an ionograph apparatus (MULTICORE CM11™). The treated circuit boards had a level of contamination comparable to the results obtained by liquid phase treatment using a solvent or ultrasound.

EXAMPLE 8

This example illustrates the use of excited or unstable gaseous atmospheres to clean post-reflow soldered articles.

Pre-tinned copper printed circuit boards were reflow soldered with two commercially available solder pastes designated "no clean" or "low residue" (HERAEUS F 372™ and MULTICORE NC73™) in nitrogen or air atmospheres.

The soldered printed circuit boards were then subjected to a cleaning treatment using an excited or unstable gas mixture from a single apparatus. The boards were treated under the following conditions:

initial gas mixture: see Table 1;

operating power: 3 kW;

flow rate of initial gas mixture: 18 $m^3$/h;

adjacent gas mixture: nitrogen;

the distance between the boards and the gas outlet of the apparatus was 10 mm; and the boards were not heated.

Post-reflow soldered circuits that were subjected to the inventive cleaning process were then tested for ionic contamination using an IONOGRAPH ALPHA METALS 500™. The ionic contamination test was conducted according to the MIL-STD-28809 standard. According to this standard, the acceptable contamination level for the post-treated printed circuit boards is 3.1 $\mu g/cm^2$. For comparison, reflow soldered circuits that were not cleaned were also tested for ionic contamination.

Table 1 shows the results of the post-reflow cleaning. From these results, it is readily apparent that:

The effectiveness of the cleaning varies from one formulation to the next;

In both cases, the reflowed boards that were not subjected to cleaning would not pass, or just barely pass the MIL standard (3.1 $\mu g/cm^2$);

In the case of the Haraeus low residue formulation (which tolerates only a nitrogen atmosphere during reflow), both the $N_2/H_2/H_2O$ initial atmosphere and the $N_2/O_2$ atmosphere resulted in a board containing low levels of contamination;

In the case of the Multicore "no clean" paste (which tolerates nitrogen or air during ref low), only the $N_2/H_2/H_2O$ initial atmosphere results in a sufficient decrease in contamination.

Although the present invention has been described with reference to particular embodiments, it is in no way limited thereby but, on the contrary, is susceptible of modifications and variants which will be apparent to the person skilled in the art in the context of the claims hereinbelow.

TABLE 1

| Solder Paste | Atmosphere used for reflow soldering | Initial Atm. for dry cleaning treatment | Ionic Contamination ($\mu g/cm^2$) |
|---|---|---|---|
| Heraeus F 372 "Low residue" Type | $N_2$ | No Treatment | 2.4 ($\sigma$ = 0.7) |
|  |  | $N_2$ + 3% $H_2$ + 1000 ppm $H_2O$ | 0.6 ($\sigma$ = 1.6) |

TABLE 1-continued

| Solder Paste | Atmosphere used for reflow soldering | Initial Atm. for dry cleaning treatment | Ionic Contamination ($\mu$g/cm$^2$) |
|---|---|---|---|
| Announced "No Clean" | | $N_2$ + 1000 ppm $O_2$ | 0.8 ($\sigma$ = 0.7) |
| Multicore NC73 "RMA" Type | Air | No Treatment | 7.7 ($\sigma$ = 1.2) |
| | | $N_2$ + 3% $H_2$ + 1000 ppm $H_2O$ | 1.7 ($\sigma$ = 0.3) |
| | | $N_2$ + 1000 ppm $O_2$ | 3.3 ($\sigma$ = 0.7) |
| Announced "No Clean" | $N_2$ | No Treatment | 5.0 ($\sigma$ = 0.6) |
| | | $N_2$ + 3% $H_2$ + 1000 ppm $H_2O$ | 2.6 ($\sigma$ = 1.2) |
| | | $N_2$ + 1000 ppm $O_2$ | 5.2 ($\sigma$ = 1.8) |

What is claimed is:

1. A method for reflow soldering metallic surfaces, said method comprising the step of:
   exposing at least one metallic surface, at close to atmospheric pressure, to a treatment gas outside a gas generating device, wherein said treatment gas comprises excited or unstable gaseous species and is substantially free of electrically charged species at conditions effective to dry clean or dry flux said at least one metallic surface.

2. The method according to claim 1, wherein said at least one metallic surface is a metallic substrate, and said exposing step is conducted prior to screen printing a soldering paste on the metallic substrate.

3. The method according to claim 2, wherein said metallic substrate is a circuit board.

4. The method according to claim 2, wherein said metallic substrate is a conducting track printed on an epoxy circuit board.

5. The method according to claim 1, wherein said at least one metallic surface is a solder paste, and said exposing step is conducted after screen printing the solder paste on a metallic substrate, but before mounting an article that is at least partially metallic on the solder paste.

6. The method according to claim 1, wherein said at least one metallic surface is a metallic surface of an article to be mounted on a metallic substrate by soldering, and said exposing step is conducted after mounting the article on the metallic substrate, but before heating the solder to reflow solder the article to the metallic substrate.

7. The method according to claim 1, wherein said exposing step is conducted during at least a portion of a heating step to cause solder reflow.

8. The method according to claim 1, wherein said exposing step is conducted after reflow soldering an at least partially metallic article to a metallic substrate.

9. The method according to claim 1, wherein said treatment gas is obtained by passing an initial gas mixture through at least one apparatus for forming excited or unstable gaseous species.

10. The method according to claim 9, wherein the initial gas mixture comprises hydrogen.

11. The method according to claim 9, wherein the initial gas mixture comprises water vapor.

12. The method according to claim 9, wherein the initial gas mixture comprises from about 50 ppm to about 6% by volume water vapor.

13. The method according to claim 9, wherein the initial gas mixture comprises from about 100 ppm to about 6% by volume water vapor.

14. The method according to claim 9, wherein the initial gas mixture comprises from about 500 ppm to 5000 ppm by volume water vapor.

15. The method according to claim 1, wherein said treatment gas is obtained from a mixture of (1) an initial gas mixture that is passed through an apparatus for forming excited or unstable gaseous species and (2) an adjacent gas mixture not having passed through said apparatus.

16. The method according to claim 15, wherein said initial gas mixture comprises hydrogen.

17. The method according to claim 15, wherein the initial gas mixture comprises water vapor.

18. A method for reflow soldering metallic surfaces, said method comprising the steps of:
   (a) screen printing a soldering paste on a metallic substrate;
   (b) mounting an at least partially metallic article on the soldering paste;
   (c) heating the solder paste to reflow solder the at least partially metallic article to the metallic substrate; and
   (d) exposing at least one of the metallic substrate, the solder paste, or the at least partially metallic article close to atmospheric pressure, to a gas, wherein said gas is outside a gas generating device and said gas comprises excited or unstable gaseous species and is substantially free of electrically charged species at conditions effective to dry flux or dry clean said metallic substrate, solder paste or at least partially metallic article.

19. The method according to claim 18, wherein said gas is obtained by passing an initial gas mixture through an apparatus for forming excited or unstable gaseous species.

20. The method according to claim 18, wherein said initial gas mixture comprises hydrogen.

21. The method according to claim 19, wherein the initial gas mixture comprises water vapor.

22. The method according to claim 19, wherein the initial gas mixture comprises from about 50 ppm to about 6% by volume water vapor.

23. The method according to claim 19, wherein the initial gas mixture comprises from about 100 ppm to about 1% by volume water vapor.

24. The method according to claim 19, wherein the initial gas mixture comprises from about 500 ppm to 5000 ppm by volume water vapor.

25. The method according to claim 18, wherein said treatment gas is obtained from a mixture of (1) an initial gas mixture that is passed through an apparatus for forming excited or unstable gaseous species and (2) an adjacent gas mixture not having passed through said apparatus.

26. The method according to claim 25, wherein said initial gas mixture comprises hydrogen.

27. The method according to claim 25, wherein the initial gas mixture comprises water vapor.

28. The method according to claim 18, wherein said metallic substrate is a circuit board.

29. The method according to claim 18, wherein said metallic substrate is conducting track printed on an epoxy circuit board.

30. The method according to claim 18, wherein said at least one metallic surface is exposed to said gas prior to, during, or after step (a).

31. The method according to claim 18, wherein said solder paste is exposed to said gas prior to, during, or after step (b).

32. The method according to claim 18, wherein the at least partially metallic article is exposed to said gas prior to, during, or after step (c).

* * * * *